(12) United States Patent
Ryu et al.

(10) Patent No.: US 10,127,102 B2
(45) Date of Patent: Nov. 13, 2018

(54) SEMICONDUCTOR MEMORY DEVICES AND MEMORY SYSTEMS INCLUDING THE SAME

(71) Applicant: Samsung Electronics Co., Ltd., Suwon-si (KR)

(72) Inventors: Ye-Sin Ryu, Seoul (KR); Hoi-Ju Chung, Yongin-si (KR); Sang-Uhn Cha, Yongin-si (KR); Young-Yong Byun, Seoul (KR); Seong-Jin Jang, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 120 days.

(21) Appl. No.: 15/229,774

(22) Filed: Aug. 5, 2016

(65) Prior Publication Data

US 2017/0083401 A1 Mar. 23, 2017

(30) Foreign Application Priority Data

Sep. 22, 2015 (KR) ........................ 10-2015-0133757

(51) Int. Cl.
*G11C 29/00* (2006.01)
*G06F 11/10* (2006.01)
*G11C 29/52* (2006.01)
*G06F 3/06* (2006.01)

(52) U.S. Cl.
CPC .......... *G06F 11/1068* (2013.01); *G06F 3/064* (2013.01); *G06F 3/0619* (2013.01); *G06F 3/0634* (2013.01); *G06F 3/0679* (2013.01); *G11C 29/52* (2013.01)

(58) Field of Classification Search
CPC .... G06F 11/1068; G06F 3/0619; G06F 3/064; G06F 3/0634; G06F 3/0679; G06F 11/1048; G06F 11/108; G06F 11/1008; G11C 29/52; G11C 29/36; G11C 29/42; G11C 29/44; G11C 29/4401; G11C 29/12; G11C 2029/3602; G11C 5/025; G11B 20/182; H03M 13/27
See application file for complete search history.

(56) References Cited

U.S. PATENT DOCUMENTS

| | | | |
|---|---|---|---|
| 5,134,616 A | 7/1992 | Barth, Jr. et al. | |
| 6,216,248 B1 * | 4/2001 | McConnell | G06F 11/1008 714/746 |
| 6,678,860 B1 | 1/2004 | Lee | |
| 7,072,237 B2 | 7/2006 | Morgan et al. | |
| 7,080,278 B1 * | 7/2006 | Kleiman | G06F 11/1076 714/6.24 |
| 7,134,069 B1 * | 11/2006 | Longwell | G06F 11/106 714/800 |
| 7,225,390 B2 | 5/2007 | Ito et al. | |

(Continued)

*Primary Examiner* — Guerrier Merant
(74) *Attorney, Agent, or Firm* — Muir Patent Law, PLLC

(57) ABSTRACT

A semiconductor memory device includes a memory cell array, a control logic circuit, an error correction circuit and a first path selection circuit. The memory cell array includes a plurality of bank arrays. The control logic circuit controls access to the memory cell array and generates a density mode signal based on a command. The first path selection circuit selectively provides write data to the error correction circuit.

20 Claims, 16 Drawing Sheets

(56) References Cited

U.S. PATENT DOCUMENTS

| | | | |
|---|---|---|---|
| 7,373,564 B2* | 5/2008 | Kikutake | G11C 29/10 365/201 |
| 7,426,683 B2 | 9/2008 | Takahashi et al. | |
| 7,440,309 B2 | 10/2008 | Hummler | |
| 7,636,880 B2 | 12/2009 | Foss | |
| 8,151,173 B2* | 4/2012 | Hirose | G06F 11/1048 365/185.09 |
| 9,043,669 B1* | 5/2015 | Bruce | H03M 13/27 714/757 |
| 9,734,009 B2* | 8/2017 | Hu | G06F 11/1068 |
| 2008/0016392 A1* | 1/2008 | Earl | G06F 11/1048 714/6.12 |
| 2008/0168331 A1 | 7/2008 | Vogelsang et al. | |
| 2008/0212352 A1* | 9/2008 | Oh | G06F 11/1008 365/51 |
| 2009/0164704 A1* | 6/2009 | Kanade | G06F 11/1068 711/103 |
| 2014/0143619 A1* | 5/2014 | Gorman | G11C 29/36 714/719 |

* cited by examiner

430

460

SEMICONDUCTOR MEMORY DEVICES AND MEMORY SYSTEMS INCLUDING THE SAME

CROSS-REFERENCE TO RELATED APPLICATIONS

This U.S. application claims the benefit of priority under 35 USC § 119 to Korean Patent Application No. 10-2015-0133757, filed on Sep. 22, 2015, in the Korean Intellectual Property Office, the contents of which are incorporated herein in their entirety by reference.

BACKGROUND

The present disclosure relates to memories, and more particularly to semiconductor memory devices and memory systems including the same.

Semiconductor memory devices may be classified into non-volatile memory devices such as flash memory devices and volatile memory devices such as DRAMs. The high speed operation and cost efficiency of DRAMs provides for their effective use as system memories. Due to the continuing shrinkage in fabrication design rules for DRAMs, bit errors in the DRAM memory cells may rapidly increase.

SUMMARY

Some exemplary implementations described herein may provide a semiconductor memory device exhibiting increased usability.

Some exemplary implementations described herein may provide a memory system including the semiconductor memory device exhibiting increase usability.

According to exemplary implementations, a semiconductor memory device includes a memory cell array, a control logic circuit, an error correction circuit and a first path selection circuit. The memory cell array includes a plurality of bank arrays. The control logic circuit controls access to the memory cell array and generates a density mode signal based on a command. The first path selection circuit selectively provides write data to the error correction circuit. Each of the bank arrays includes at least a first sub array and a second sub array.

In exemplary implementations, the control logic circuit may generate the density mode signal to the first path selection circuit such that the write data does not pass through the error correction circuit in a first density mode.

In exemplary implementations, the control logic circuit may generate the density mode signal to the first path selection circuit such that the write data passes through the error correction circuit in a second density mode different from a first density mode. Each of the bank arrays includes at least a first sub array and a second sub array that are distinct from each other by at least one bit of a row address.

The error correction circuit may generate parity data by performing an error correction code (ECC) encoding on the write data in the second density. The first sub array may be used as a data region in which the write data is stored and the second sub array may be used as a parity region in which the parity data is stored in the second density mode.

An input/output path for the write data may be different from an input/output path for the parity data.

A first parity data associated with a first write data stored in the first sub array of a first bank array of the bank arrays may be stored in the second sub array of a second bank array of the bank arrays. A second parity data associated with a second write data stored in the first sub array of the second bank array is stored in the second sub array of the first bank array.

A first word-line connected to a first memory cell row in the first sub array of the first bank array and a second word-line connected to a second memory cell row in the second sub array of the second bank array may be simultaneously enabled.

In exemplary implementations, the semiconductor memory device may further include an input/output gating circuit connected to the memory cell array, the error correction circuit and the first path selection circuit. A number of circuit components, in the I/O gating circuit, associated with an access to the memory cell array may be constant without regard to a density mode designated by the density mode signal.

In exemplary implementations, a first storage capacity of the semiconductor memory device in a first density mode may be greater than a second storage capacity of the semiconductor memory device in a second density mode different from the first density mode.

In exemplary implementations, the semiconductor memory device may further include a second path selection circuit. The second path selection circuit may selectively provide the error correction circuit with read data stored in the memory cell array, in response to the density mode signal.

The error correction circuit may include an ECC engine and a data corrector. The ECC engine may generate syndrome data by performing an ECC decoding the read data and parity data stored in the memory cell array. The data corrector may selectively correct at least one error bit in the read data based on the syndrome data.

The data corrector may include a syndrome decoder, a bit inverter and a selection circuit. The syndrome decoder may generate a decoding signal and a selection signal by decoding the syndrome data, the decoding signal may indicate a position of the at least one error bit, and the selection signal may have a logic level depending on a number of the at least one error bit. The bit inverter may invert the at least one error bit based on the decoding signal. The selection circuit may output one of an output of the bit inverter and the read data in response to the selection signal.

In exemplary implementations, the memory cell array may include a three-dimensional memory cell array and each of the bank arrays may include a plurality of dynamic memory cells.

In exemplary implementations, the memory cell array may include a three-dimensional memory cell array and each of the bank arrays may include a plurality of resistive type memory cells.

According to exemplary implementations, a memory system includes at least one semiconductor memory device and a memory controller. The memory controller controls the at least one semiconductor memory device. The at least one semiconductor memory device includes a memory cell array, a control logic circuit, an error correction circuit and a first path selection circuit. The memory cell array includes a plurality of bank arrays. The control logic circuit controls access to the memory cell array and generates a density mode signal based on a command from the memory controller. The first path selection circuit selectively provides write data to the error correction circuit. Each of the bank arrays includes at least a first sub array and a second sub array.

Accordingly, a semiconductor memory device according to exemplary implementations includes an error correction circuit and a memory cell array. The semiconductor memory device may increase yield and usability by storing data in the memory cell array without passing through the error correction circuit in a first density mode and storing data in a first region of the memory cell array and parity data in a second region of the memory cell array via the error correction circuit in a second density mode.

BRIEF DESCRIPTION OF THE DRAWINGS

Exemplary implementations will be described below in more detail with reference to the accompanying drawings.

DETAILED DESCRIPTION

Figure 1:
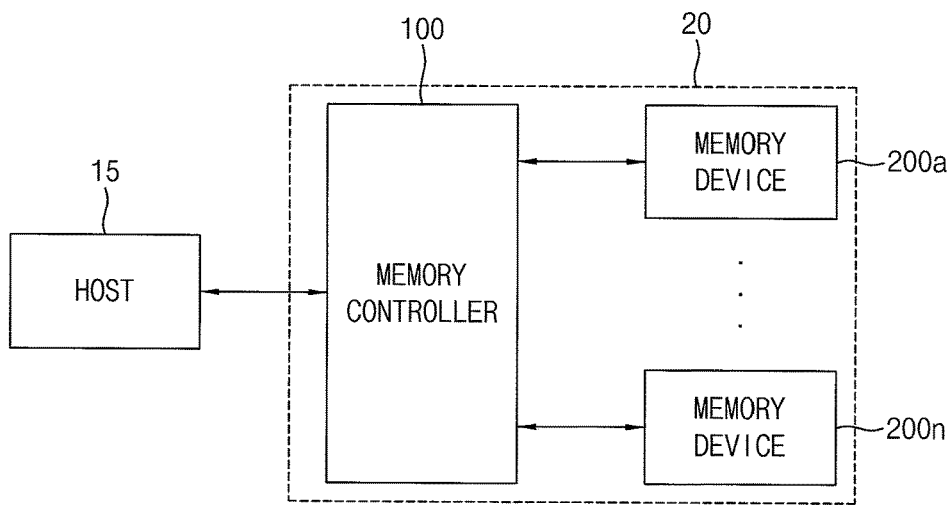
FIG. 1 is a block diagram illustrating an electronic system according to example embodiments.

Various exemplary implementations will be described more fully hereinafter with reference to the accompanying drawings, in which some exemplary implementations are shown. However, the present inventive concept may be embodied in many different forms and should not be construed as limited to the exemplary implementations set forth herein. These exemplary implementations are just for disclosing of the inventive concept and many implementations and variations are possible that do not require all of the details provided herein. It should also be emphasized that alternative exemplary implementations are provided, but such listing of alternatives is not exhaustive. Furthermore, any consistency of detail between various exemplary implementations should not be interpreted as requiring such detail—it is impracticable to list every possible variation for every feature described herein. The language of the claims should be referenced in determining the requirements of the present inventive concept.

In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are generally used to distinguish one element from another. Thus, a first element discussed below in one section of the specification could be termed a second element in a different section of the specification without departing from the teachings of the present inventive concept. Also, terms such as "first" and "second" may be used in the claims to name an element of the claim, even thought that particular name is not used to describe in connection with the element in the specification. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to exemplary implementations.

As shown in FIG. 1, an electronic system 10 may include a host 15 and a memory system 20. The memory system 20 may include a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a~200n. For example, the memory controller 100 may write data in the plurality of semiconductor memory devices 200a~200n or read data from the plurality of semiconductor memory devices 200a~200n in response to request from the host 20.

In addition, the memory controller 100 may issue operation commands to the plurality of semiconductor memory devices 200a~200n for controlling the plurality of semiconductor memory devices 200a~200n.

In some exemplary implementations, each of the plurality of semiconductor memory devices 200a~200n may be a may be a memory device including resistive type memory cells such as a magnetoresistive random access memory (MRAM), a resistive random access memory (RRAM), a phase change random access memory (PRAM) and a ferro-electric random access memory (FRAM), etc. In other exemplary implementations, each of the plurality of semiconductor memory devices 200a~200n may be a memory device including dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 2:
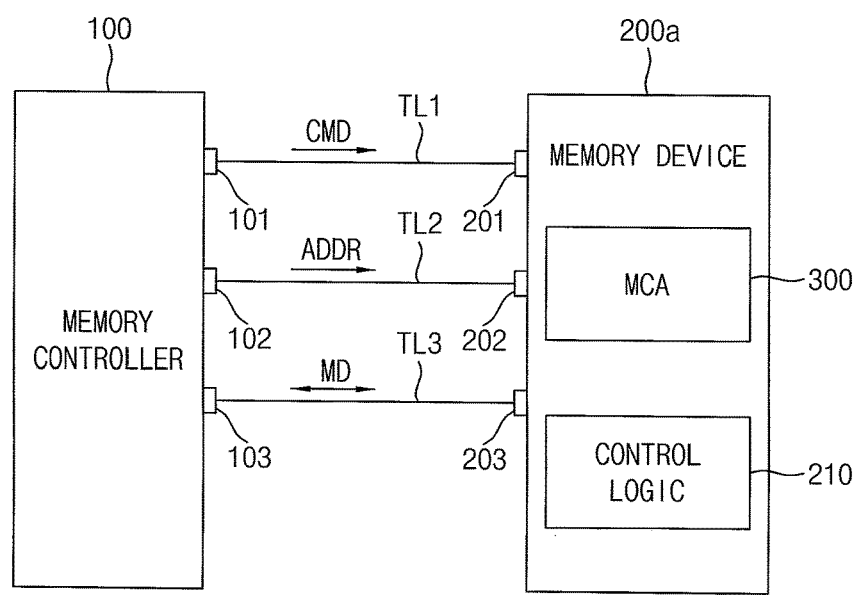
FIG. 2 is a block diagram illustrating the memory system shown in FIG. 1.

FIG. 2 is a block diagram illustrating the memory system shown in FIG. 1.

In FIG. 2, only one semiconductor memory device 200a in communication with the memory controller 100 is illustrated for convenience. However, the details discussed herein related to semiconductor memory device 200a may equally apply to the other semiconductor memory devices 200b~200n.

As shown in FIG. 2, the memory system 20 may include the memory controller 100 and the semiconductor memory device 200*a*. Each of the memory controller 100 and the semiconductor memory device 200*a* may be formed as a separate semiconductor chip or as a separate group of chips (e.g., the memory controller 100 and the semiconductor memory device 200*a* may be packaged together in stacking form of the semiconductor chips). The memory controller 100 and the semiconductor memory device 200*a* may be connected to each other through corresponding command pins 101 and 201, corresponding address pins 102 and 202, and corresponding data pins 103 and 203. The command pins 101 and 201 may transmit a command signal CMD through a command transmission line(s) TL1, the address pins 102 and 202 may transmit an address signal ADDR through an address transmission line(s) TL2, and the data pins 103 and 203 may exchange main data MD through a data transmission line(s) TL3. Transmission lines TL1, TL2 and TL3 may each be formed as a single transmission line (e.g., for serial communications) or as a plurality of transmission lines (e.g., for parallel communications or for several serial communications).

The semiconductor memory device 200*a* may include a memory cell array 300 that stores the main data MD and the control logic circuit 210 that controls access to the memory cell array 300.

Figure 3:
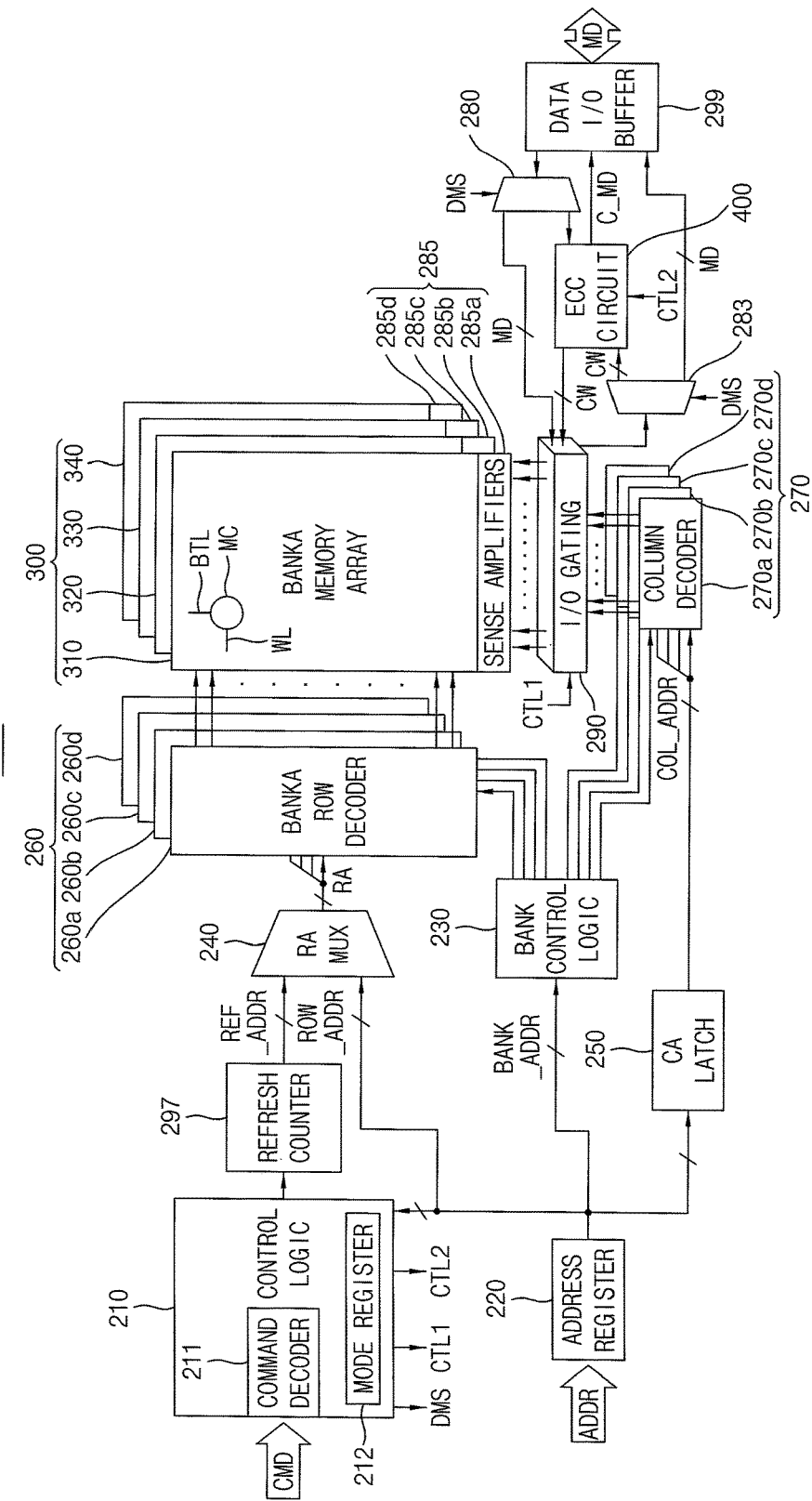
FIG. 3 is a block diagram illustrating the semiconductor memory device shown in FIG. 2, according to example embodiments.

FIG. 3 is a block diagram illustrating the semiconductor memory device 200*a* shown in FIG. 2, according to exemplary implementations.

As shown in FIG. 3, the semiconductor memory device 200*a* may include a control logic (or the control logic circuit) 210, an address register 220, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, the error correction circuit 400, a first path selection circuit 280, a second path selection circuit 283 and a data input/output (I/O) buffer 299.

In some exemplary implementations, the refresh counter 297 may not be included in the semiconductor memory device 200*a*.

The memory cell array 300 may include first through fourth bank arrays 310~340 that may be accessed simultaneously (read, write, refresh, e.g.). The row decoder 260 may include first through fourth bank row decoders 260*a*~260*d* respectively coupled to the first through fourth bank arrays 310~340, the column decoder 270 may include first through fourth bank column decoders 270*a*~270*d* respectively coupled to the first through fourth bank arrays 310~340, and the sense amplifier unit 285 may include first through fourth bank sense amplifiers 285*a*~280*d* respectively coupled to the first through fourth bank arrays 310~340. Each of the first through fourth bank arrays 310~340 may include a plurality of memory cells MC, and each of memory cells MC is coupled to a corresponding word-line WL and a corresponding bit-line BTL. The first through fourth bank arrays 310~340, the first through fourth bank row decoders 260*a*~260*d*, the first through fourth bank column decoders 270*a*~270*d* and first through fourth bank sense amplifiers 285*a*~280*d* may form first through fourth banks. Although the semiconductor memory device 200*a* shown in FIG. 3 illustrates four banks, the semiconductor memory device 200*a* may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260*a*~260*d* corresponding to the bank address BANK_ADDR may be activated in response to the bank control signals, and one of the first through fourth bank column decoders 270*a*~270*d* corresponding to the bank address BANK_ADDR may be activated in response to the bank control signals.

The refresh counter 297 may be included when the semiconductor memory device 200*a* is implemented by DRAM. The refresh counter 297 may generate a refresh row address REF_ADDR for refreshing memory cell rows in the memory cell array 300 under control of the control logic 210. The refresh counter 297 may be included when the memory cells MC are implemented with dynamic memory cells.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260*a*~260*d*.

The activated one of the first through fourth bank row decoders 260*a*~260*d* may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270*a*~270*d*.

The activated one of the first through fourth bank column decoders 270*a*~270*d* may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. The data stored in the read data latches may be provided to the memory controller 100 selectively via the error correction circuit 400 and through the data I/O buffer 299 according to a density mode. Main data MD to be written in one bank array of the first through fourth bank arrays 310~340 may be provided to the data I/O buffer 299 from the memory controller 100. The main data MD provided to the data I/O buffer 299 is selectively provided to the error correction circuit 400. In a first density mode, the main data MD is written in one bank array of the first through fourth bank arrays 310~340 through the write driver without passing through the error correction circuit 400. In a second density mode, the main data MD is encoded to a codeword CW in the error correction circuit 400. The write driver may then write the codeword CW in one bank array of the first through fourth bank arrays 310~340.

The data I/O buffer 299 provides the main data MD to the first path selection circuit 280 in a write operation and provides the main data MD from the error correction circuit 400 or from the second path selection circuit 283 to the memory controller 100 in a read operation.

The first path selection circuit 280 provides the main data MD to the I/O gating circuit 290 in a first density mode and provides the main data MD to the error correction circuit 400 in a second density mode, in response to a density mode signal DMS. The second path selection circuit 283 provides the main data MD from the I/O gating circuit 290 to the data I/O buffer 299 in the first density mode and provides the codeword CW from the I/O gating circuit 290 to the error correction circuit 400 in the second density mode, in response to a density mode signal DMS.

The error correction circuit 400, in a write operation of the second density mode, may generate parity data based on the main data MD from the data I/O buffer 299, and may provide the I/O gating circuit 290 with the codeword CW which may comprise the main data MD and the parity data. The I/O gating circuit 290 may write the main data MD of the codeword CW in a first sub array and write the parity data of the codeword CW in a second sub array. The first sub array and the second sub array may belong to different bank arrays. In this example, the error correction code appended to the main data to create the codeword CW is parity data (e.g., such as parity data of a Hamming code). However, other error correction codes may be used other than parity data in the embodiments described herein. Error correction codes that may be used with the embodiments described herein include Hamming codes, Hsiao codes, Reddy codes, finite field based codes and Bose-Chaudhuri-Hocquenghem codes, e.g. In some examples, the error correction circuit 400 may modify the format and/or length of the main data MD as part of generating the codeword CW (e.g. 8 bits of main data MD may be transformed into a coded 12 bit codeword that does not include the same original 8 bits of main data MD, although the main data may still be represented in the codeword CW). In some examples, only an error detection circuit may be used instead of or as part of the error correction circuit 400.

In addition, the error correction circuit 400, in a read operation of the second density mode, may receive the codeword CW, read from the first sub array and the second sub array of the memory cell array 300, from the I/O gating circuit 290. The error correction circuit 400 may perform an ECC decoding on the main data MD based on the parity data in the codeword CW, may correct a single bit error in the main data MD and may provide corrected main data to the data I/O buffer 299.

The control logic circuit 210 may control operations of the semiconductor memory device 200a. For example, the control logic circuit 210 may generate control signals for the semiconductor memory device 200a in order to perform a write operation or a read operation. The control logic circuit 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the I/O gating circuit 290, a second control signal CTL2 to control the error correction circuit 400 and the density mode signal DMS indicating a density mode by decoding the command CMD. The control logic circuit 210 provides the density mode signal DMS to the first and second path selection circuits 280 and 283.

FIGS. 4A to 4E are circuit diagrams of exemplary implementations of the memory cell shown in FIG. 3.

Figure 4A:
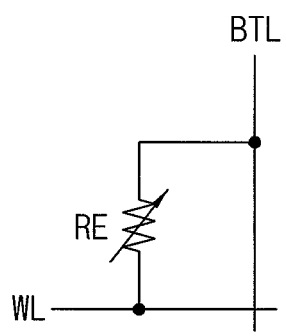
FIGS. 4A to 4E are circuit diagrams of examples of the memory cell shown in FIG. 3, according to example embodiments.
Figure 4B:
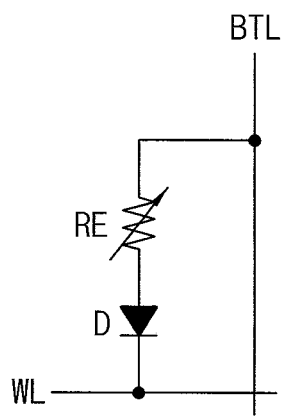
Figure 4C:
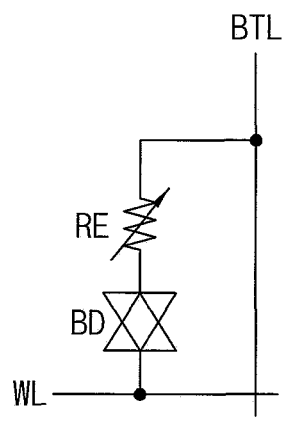
Figure 4D:
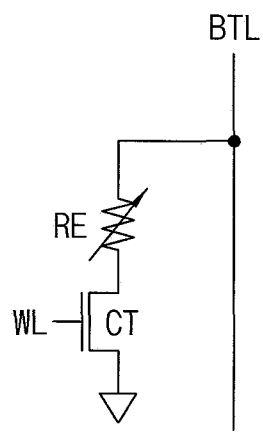
Figure 4E:
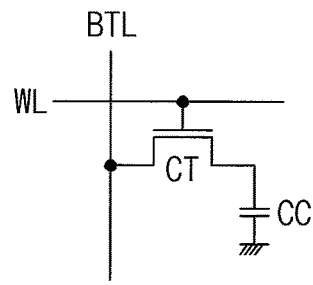

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

As shown in FIG. 4A, a memory cell MC may include a resistive element RE connected to a bit-line BTL and a word-line WL. Such a resistive memory cell having a structure without a selection element may store data by a voltage applied between bit-line BL and word-line WL.

As shown in FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BTL. The diode D may be coupled between the resistive element RE and word-line WL, and the resistive element RE may be coupled between the bit-line BTL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

As shown in FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BTL and bidirectional diode BD. Positions of the bidirectional diode BD and the resistive element RE may be interchangeable. The bidirectional diode BD may block leakage current flowing to an unselected semiconductor memory cell.

As shown in FIG. 4D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BTL and the transistor CT. Positions of the transistor CT and the resistive element RE may be interchangeable. The semiconductor memory cell may be selected or unselected depending on whether the transistor CT drive by word-line WL is turned on or turned off.

As shown in FIG. 4E, a memory cell MC may include a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage (not illustrated).

Figure 5:
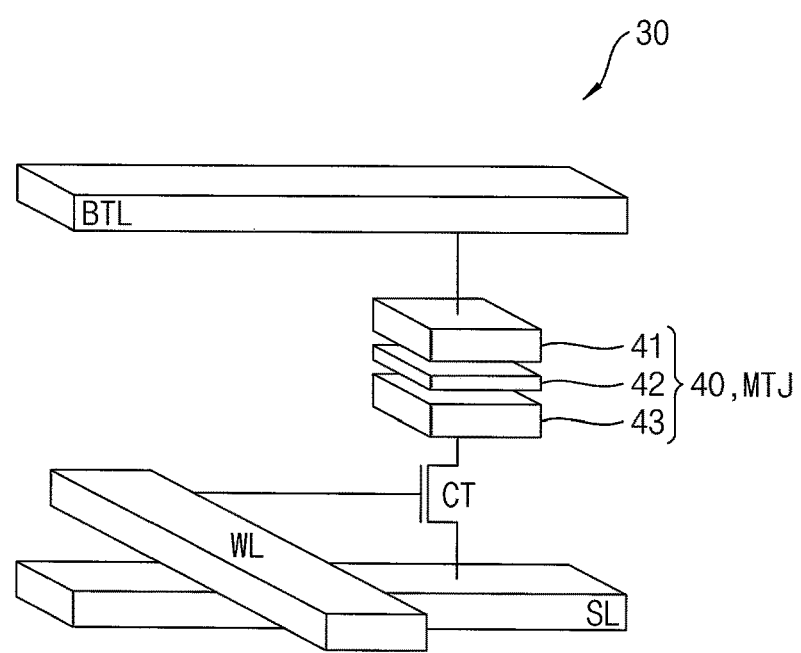
FIG. 5 illustrates an example of the memory cell (referred to as STT-MRAM cell) shown in FIG. 3, according to example embodiments.

FIG. 5 illustrates an example of the memory cell (referred to as STT-MRAM cell) shown in FIG. 3, according to exemplary implementations.

As shown in FIG. 5, an STT-MRAM cell 30 may include a MTJ element 40 and a cell transistor CT. A gate of the cell transistor CT is connected to a word-line WL and one electrode of the cell transistor CT is connected through the MTJ 40 to a bit-line BTL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL to turn on the cell transistor CT. A program current, for example, a write current is applied to the bit-line BTL and the source line SL. A direction of the write current is determined by a logic state of the MTJ element 40.

In order to perform a read operation of the STT-MRAM cell 30, a logic high voltage is applied to the word-line WL to turn on the cell transistor CT, and a read current is supplied to the bit-line BTL and the source line SL. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 6A:
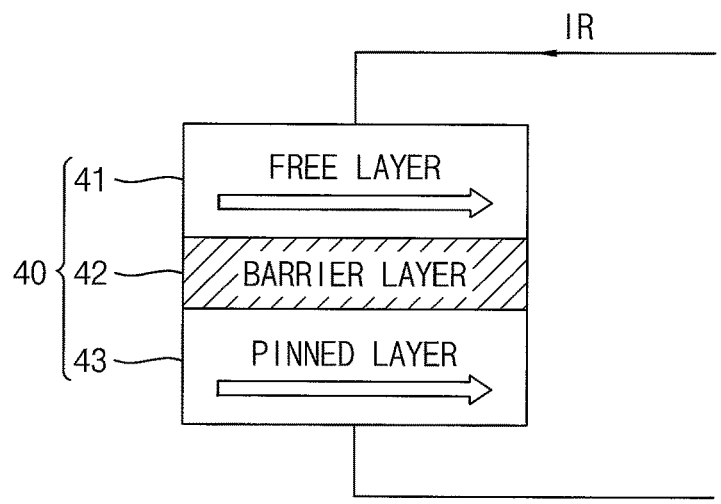
FIGS. 6A and 6B illustrate a magnetization direction according to data written to the MTJ element shown in FIG. 5.
Figure 6B:
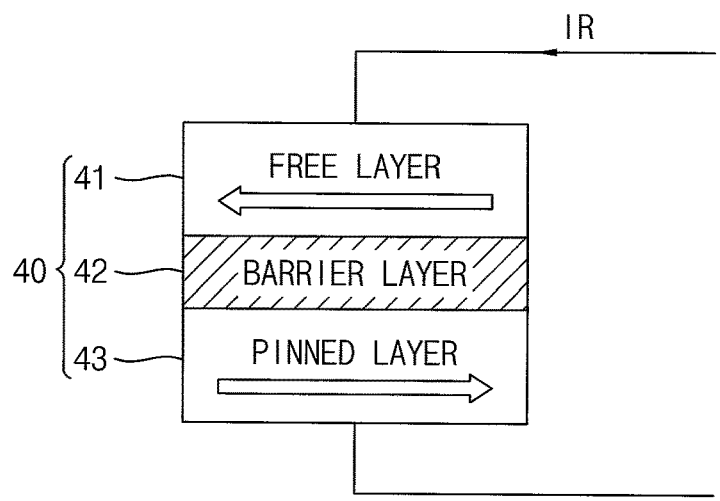

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

As shown in FIG. 6A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

As shown in FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
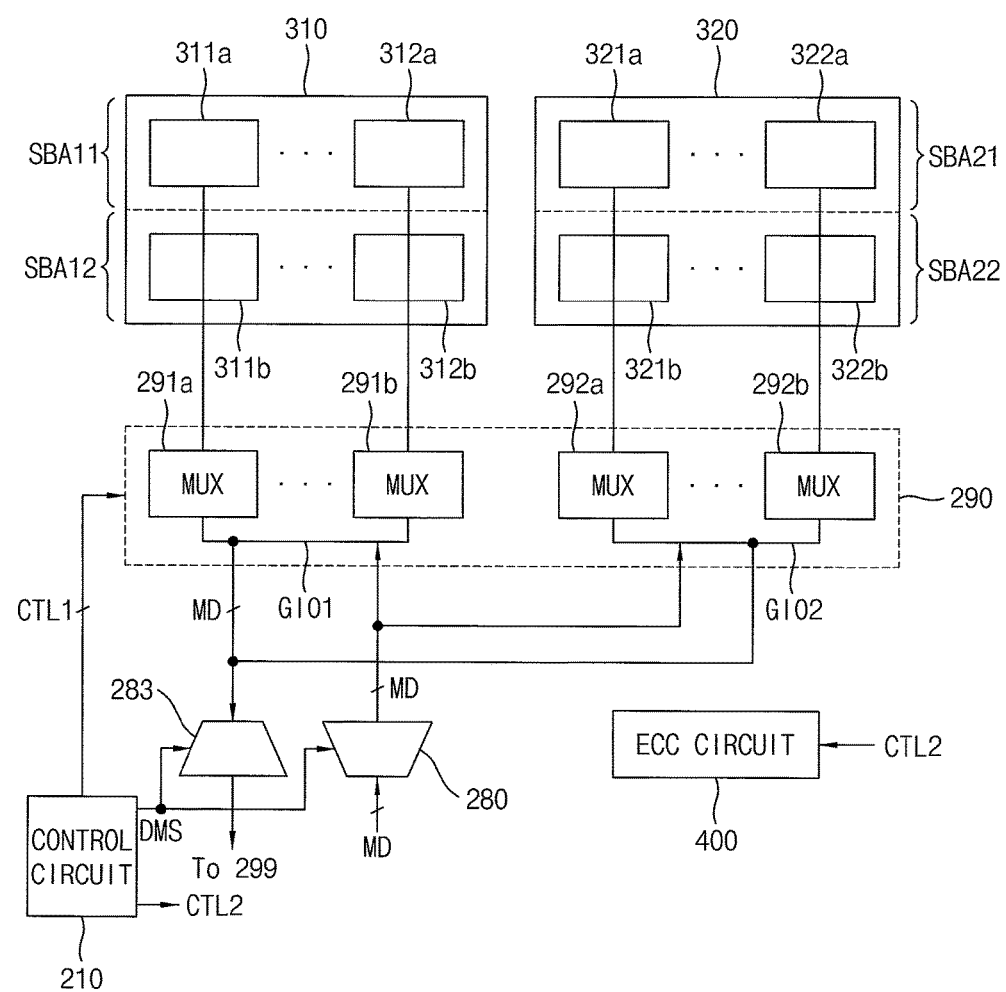
FIG. 7 illustrates a portion of the semiconductor memory device of FIG. 3 in the first density mode.

FIG. 7 illustrates a portion of the semiconductor memory device of FIG. 3 in the first density mode.

In FIG. 7, the control logic circuit 210, the first bank array 310, the second bank array 320, the I/O gating circuit 290, the first path selection circuit 280, the second path selection circuit 283, and the error correction circuit 400 are illustrated.

As shown in FIG. 7, the first bank array 310 may include a first sub array SBA11 and a second sub array SBA12, the first sub array SBA11 may include a plurality of first memory blocks 311a and 312a and the second sub array SBA12 may include a plurality of second memory blocks 311b and 312b. The first sub array SBA11 and the second sub array SBA12 may be separated logically or physically. For example, the first sub array SBA11 and the second sub array SBA12 may be distinct from each other by at least one bit of the row address ROW_ADDR in FIG. 3.

The second bank array 320 may include a first sub array SBA21 and a second sub array SBA22, the first sub array SBA21 may include a plurality of first memory blocks 321a and 322a and the second sub array SBA22 may include a plurality of second memory blocks 321b and 322b. The first sub array SBA21 and the second sub array SBA22 may be separated logically or physically. For example, the first sub array SBA21 and the second sub array SBA22 may be distinct from each other by at least one bit of the row address ROW_ADDR in FIG. 3.

In each of the first memory blocks 311a and 312a, the second memory blocks 311b and 312b, the first memory blocks 321a and 322a and the second memory blocks 321b and 322b, a plurality of first memory cells are arrayed in rows and columns.

In each of the first memory blocks 311a and 312a, the second memory blocks 311b and 312b, the first memory blocks 321a and 322a and the second memory blocks 321b and 322b, rows may be formed, for example, of 8K word-lines and columns may be formed, for example, of 1K bit-lines. Memory cells connected to intersections of the word-lines and the bit-lines may be dynamic memory cells or resistive type memory cells.

The I/O gating circuit 290 includes a plurality of first switching circuits 291a and 291b respectively connected to the first memory blocks 311a and 312a and the second memory blocks 311b and 312b and includes a plurality of second switching circuits 292a and 292b respectively connected to the first memory blocks 321a and 322a and the second memory blocks 321b and 322b. In the semiconductor memory device 200a, bit lines corresponding to data of a burst length (BL) may be simultaneously accessed to support the BL indicating the maximum number of column positions that are accessible. For example, if the BL is set to 8, data bits may be set to 128 bits.

In the first density mode, the first path selection circuit 280 and the second path selection circuit 283 may be connected to the first switching circuits 291a and 291b through first data lines GIO1 and to the second switching circuits 292a and 292b through second data lines GIO2, in response to the density mode signal DMS.

In the first density mode, the control logic circuit 210 provides the first control signal CTL1 to the I/O gating circuit 290 such that the main data MD is stored in the first memory blocks 311a and 312a and the data stored in the first memory blocks 311a and 312a is provided to the data I/O buffer 299 through the first switching circuits 291a and 291b. The first switching circuits 291a and 291b cut off connection with the second bank array 320 in response to the first control signal CTL1.

Figure 8:
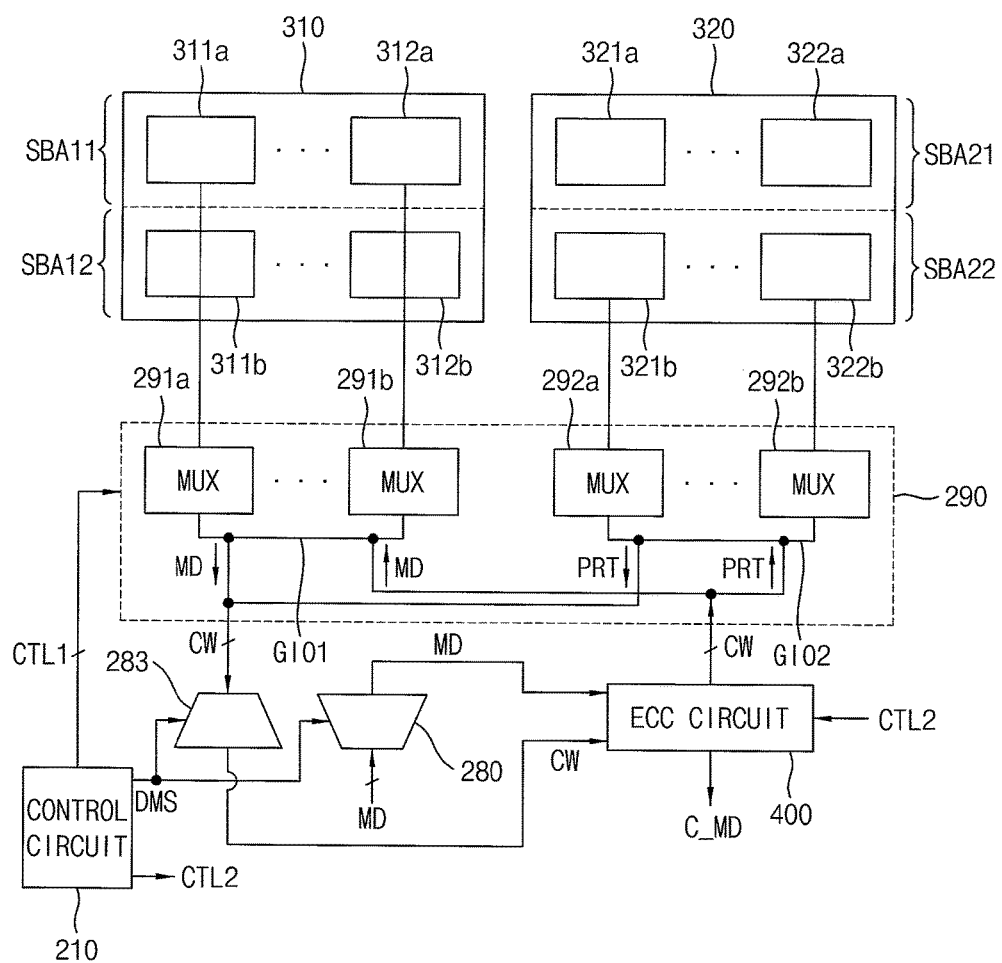
FIG. 8 illustrates a portion of the semiconductor memory device of FIG. 3 in the second density mode.

FIG. 8 illustrates a portion of the semiconductor memory device of FIG. 3 in the second density mode.

Referring to FIG. 8, in the second density mode, the first path selection circuit 280 and the second path selection circuit 283 may be connected to the error correction circuit 400 in response to the density mode signal DMS, the error correction circuit 400 is connected to the first switching circuits 291a and 291b through first data lines GIO1 and to the second switching circuits 292a and 292b through second data lines GIO2.

In the second density mode, the control logic circuit 210 provides the first control signal CTL1 to the I/O gating circuit 290 such that the main data MD is stored in the first memory blocks 311a and 312a through the first switching circuits 291a and 291b and the parity data PRT is stored in a portion of the second memory blocks 321b and 322b through the second switching circuits 292a and 292b. In addition, in the second density mode, the control logic circuit 210 provides the first control signal CTL1 to the I/O gating circuit 290 such that the main data MD of the codeword CW stored in the in the first memory blocks 311a and 312a is provided to the error correction circuit 400 and the parity data PRT stored in a portion of the second memory blocks 321b and 322b is provided to the error correction circuit 400 through the second path selection circuit 283.

The error correction circuit 400, in a write operation of the second density mode, generates the parity data PRT by performing ECC encoding on the main data MD, the main data MD is stored in the first memory blocks 311a and 312a through the first switching circuits 291a and 291b and the parity data PRT is stored in a portion of the second memory blocks 321b and 322b through the second switching circuits 292a and 292b. The error correction circuit 400, in a read operation of the second density mode, receives the codeword CW stored in the first memory blocks 311a and the second memory blocks 321b and 322b through the switching circuits 291a, 291b, 292a and 292b, detects and corrects one or more bit errors (if present) in the main data MD by performing an ECC decoding on the main data MD and outputs corrected main data C_MD. As is known, the maximum amount of bit errors in the main data MD that may be corrected by the error correction circuit depends on the type of ECC coding performed on the main data MD.

The control logic circuit 210 provides the first control signal CTL1 to the switching circuits 291a, 291b, 292a and 292b, provides the second control signal CTL to the error correction circuit 400 and provides the density mode signal DMS to the first and second path selection circuits 280 and 283.

When the parity data PRT is stored in the second sub array SBA22 in the second density mode, additional circuitry is not required for performing ECC because a same I/O configuration as for storing data in the second sub array SBA22 is used. That is, a number of circuit components, in the I/O gating circuit 290, associated with an access to the first and second bank arrays 310 and 320 is constant without regard to a density mode designated by the density mode signal.

Figure 9:
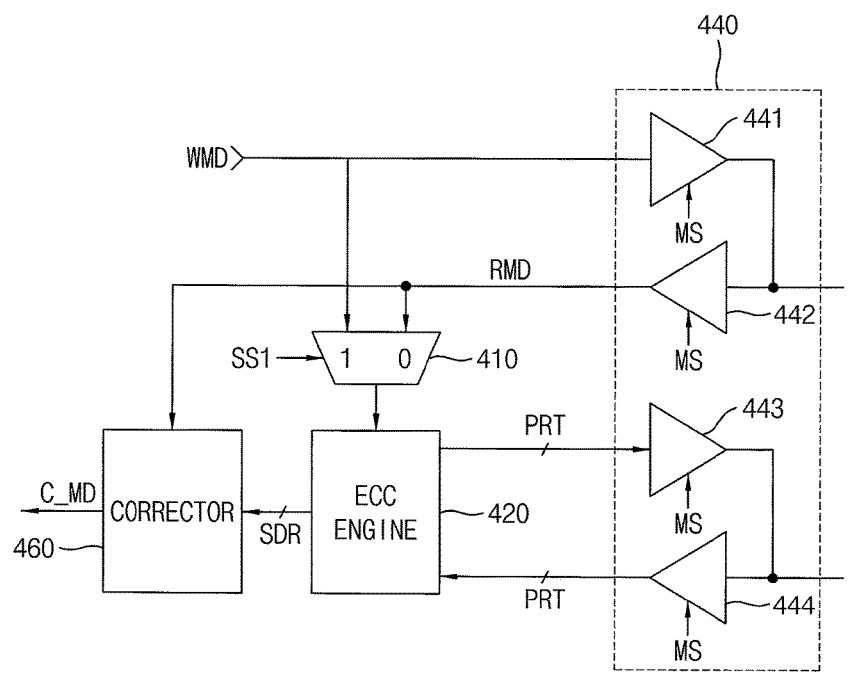
FIG. 9 illustrates the error correction circuit shown in FIG. 3 according to exemplary implementations.

FIG. 9 illustrates the error correction circuit shown in FIG. 3 according to example embodiments.

As shown in FIG. 9, the error correction circuit 400 may include a multiplexer 410, an ECC engine 420, a buffer unit 440 and a data corrector 460. The buffer unit 440 may include first through fourth buffers 441~444.

The multiplexer 410, in a write operation of the second density mode, provides the ECC engine 420 with the write data WMD in response to a first selection signal SS1. The multiplexer 431, in a read operation of the second density mode, provides the ECC engine 420 with read data RMD from the buffer 442 in response to the first selection signal SS1.

The buffers 441 and 443 may be enabled in the write operation of the second density mode in response to a mode signal MS and provide the write data WMD and the parity data PRT to the I/O gating circuit 290. The buffers 442 and 444 may be enabled in the read operation of the second density mode in response to the mode signal MS, the buffer 442 may provide the read data RMD to the multiplexer 410 and the data corrector 460 and the buffer may provide the parity data PRT to the ECC engine 420.

The ECC engine 420, in the write operation of the second density mode, may perform an ECC encoding on the write data WMD to provide the parity data PRT to the buffer 443. The ECC engine 460, in the read operation of the second density mode, may perform an ECC decoding on the read data RMD from the multiplexer 410 based on the parity data PRT from the buffer 444 to provide syndrome data SDR to the data corrector 460.

The data corrector 460, in the second density mode, corrects an error in the read data RMD based on the syndrome data SDR from the ECC engine 420 to provide corrected main data C_MD.

In FIG. 9, the first selection signal SS1 and the mode signal MS may be included in the second control signal CTL2 from the control logic circuit 210 in FIG. 7.

Figure 10:
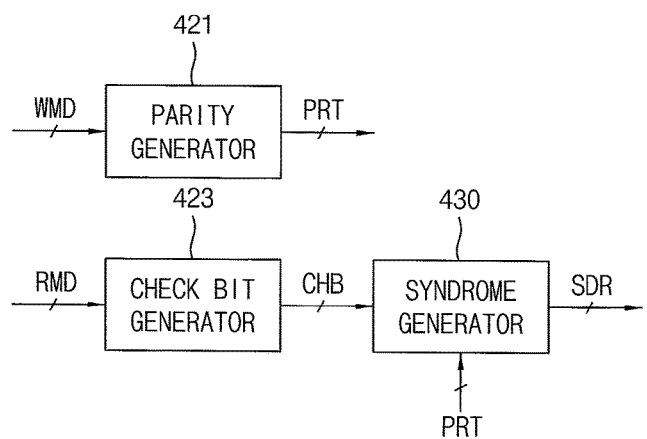
FIG. 10 illustrates the ECC engine in the error correction circuit shown in FIG. 9 according to exemplary implementations.

FIG. 10 illustrates the ECC engine in the error correction circuit shown in FIG. 9 according to example embodiments.

As shown in FIG. 10, the ECC engine 420 may include a parity generator 421, a check bit generator 423, and a syndrome generator 430.

The parity generator 421 may generate the parity data PRT based on the write data WMD using an array of exclusive OR gates.

The check bit generator 423 may generate check bits CHB based on the read main data RMD. The syndrome generator 430 may generate the syndrome data SDR based on the check bits CHB based on the read data RMD and the parity data PRT from the buffer 444 in the second density mode.

Figure 11:
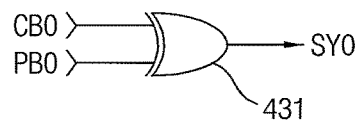
FIG. 11 illustrates the syndrome generator in the ECC engine shown in FIG. 10 according to exemplary implementations.
Figure 11:
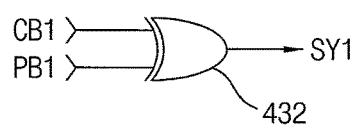
Figure 11:
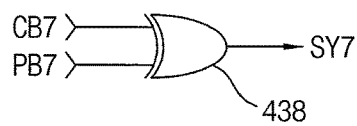

FIG. 11 illustrates the syndrome generator in the ECC engine shown in FIG. 10 according to example embodiments.

In FIG. 11, it is assumed that the check bits CHB include 8 bits CB0~CB7 and the syndrome data SDR includes 8 bits SY0~SY7.

As shown in FIG. 11, the syndrome generator 430 may include a plurality of exclusive OR gates 431~438. Each of the exclusive OR gates 431~438 may perform an exclusive OR operation on corresponding one of the check bits CB0~CB7 and corresponding one of the parity bits PB0~PB7 to generate corresponding one of syndromes SY0~SY7. Therefore, the syndrome generator 430 may generate the syndromes SY0~SY7, and each of the syndromes SY0~SY7 may have a logic level according to whether corresponding one of the check bits CB0~CB7 and corresponding one of the parity bits PB0~PB7 are same with respect to each other. When the check bit CB is different from the parity bit PB0, the corresponding syndrome SY0 may have a first logic level (logic high level). When the check bit CB is same as the parity bit PB0, the corresponding syndrome SY0 may have a second logic level (logic low level).

Figure 12:
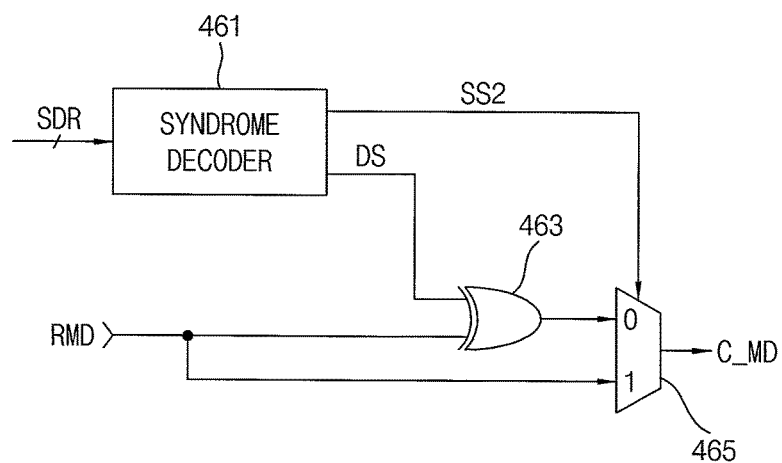
FIG. 12 illustrates the data corrector in the error correction circuit shown in FIG. 9 according to exemplary implementations.

FIG. 12 illustrates the data corrector in the error correction circuit shown in FIG. 9 according to example embodiments.

As shown in FIG. 12, the data corrector 460 may include a syndrome decoder 461, a bit inverter 463 and a selection circuit 465 which is implemented by a multiplexer.

The syndrome decoder 461 may decode the syndrome data SDR to generate a decoding signal DS and a second selection signal SS2. The decoding signal DS may indicate a position of the at least one error bit and the second selection signal SS2 may have a logic level depending on a number of the at least one error bit. The bit inverter 463 may invert the at least one error bit in response to the decoding signal DS. The selection circuit 465 may select one of the read data RMD and an output of the bit inverter 463 to provide the corrected main data C_MD in response to the second selection signal SS2.

The syndrome decoder 461 may output the second selection signal SS2 with a first logic level when a number of the at least one error bit in the read data RMD exceeds the error correction capability of the ECC based on the syndrome data SDR. The selection circuit 465 may provide the read data RMD as the corrected main data C_MD in response to the second selection signal SS2 having a first logic level. The syndrome decoder 461 may output the decoding signal DS with a first logic level and output the second selection signal SS2 with a second logic level when a number of the at least one error bit in the read data RMD is within the error correction capability of the ECC based on the syndrome data SDR. The bit inverter 493 may invert the at least one error bit in response to the decoding signal DS having a first logic level. The selection circuit 465 may provide the output of the bit inverter 463 as the corrected main data C_MD in response to the second selection signal SS2 having a second logic level.

Figure 13:
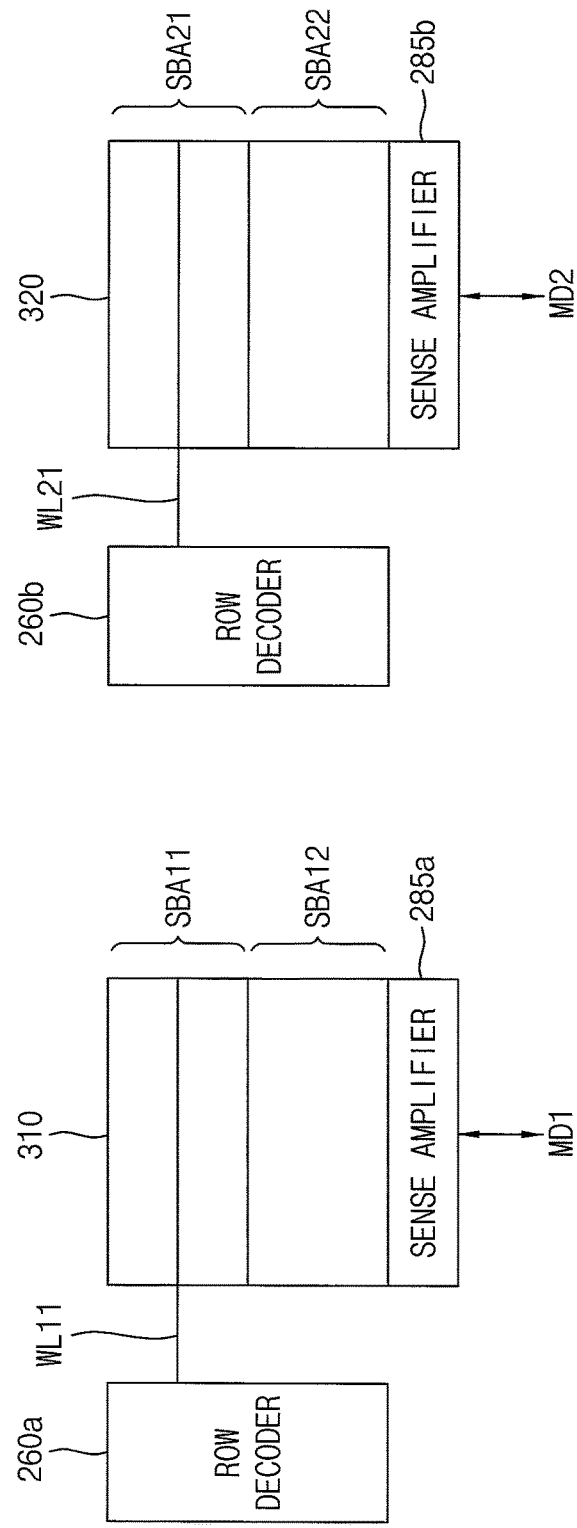
FIG. 13 illustrates operation of the semiconductor memory device of FIG. 3 in the first density mode.
Figure 14:
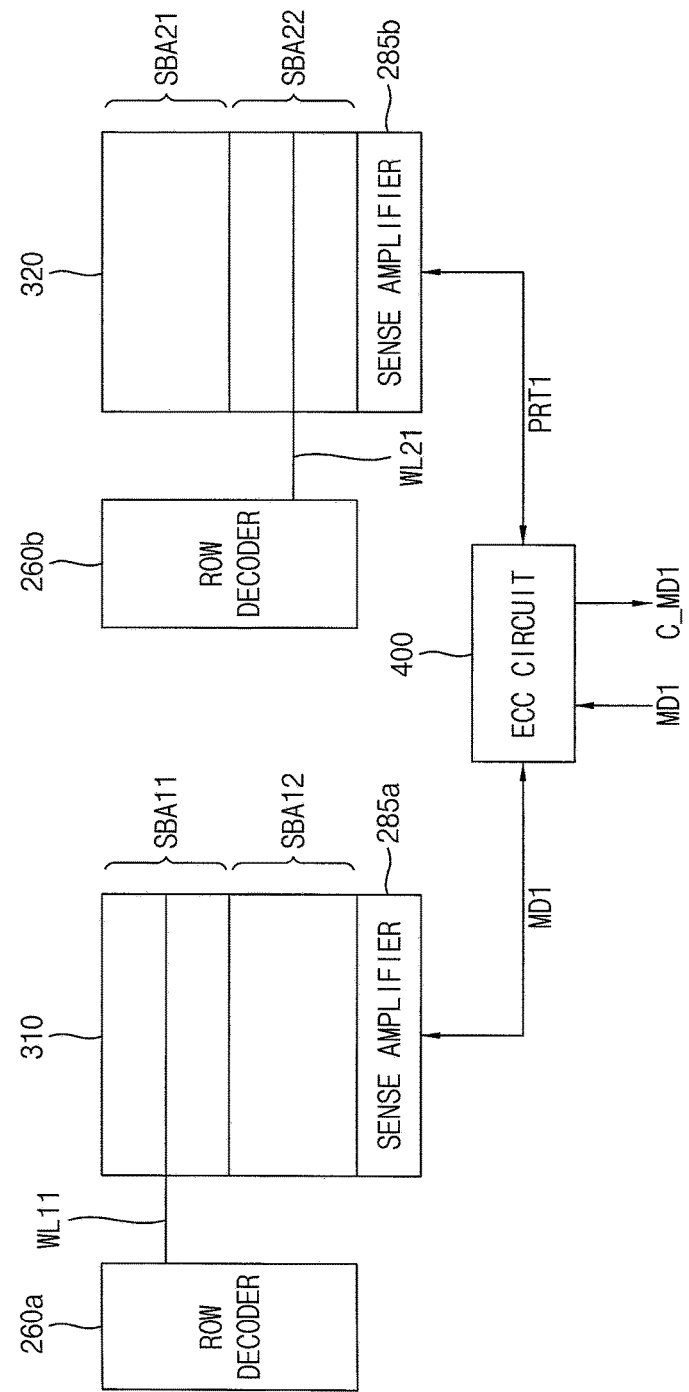
FIG. 14 illustrates operation of the semiconductor memory device of FIG. 3 in the second density mode.

FIG. 13 illustrates operation of the semiconductor memory device of FIG. 3 in the first density mode and FIG. 14 illustrates operation of the semiconductor memory device of FIG. 3 in the second density mode.

In FIG. 13, the first bank array 310, circuit components 260a and 285a associated with the first bank array 310, the second bank array and circuit components 260b and 285b associated with the second bank array 320 are illustrated and in FIG. 14, the error correction circuit 400 is further illustrated.

As shown in FIGS. 3, 7 and 13, in the first density mode of the semiconductor memory device 200a, a first main data MD1 is stored in the first sub array SBA11 of the first bank array 310 and the first main data MD1 is read from the first sub array SBA11 of the first bank array 310. The first row decoder 260a stores the first main data MD1 in a memory cell row connected to a first word-line WL11 or reads the first main data MD1 from the memory cell row connected to the first word-line WL11 by enabling the first word-line WL11 in the first sub array SBA11. In addition, in the first density mode of the semiconductor memory device 200a, a second main data MD2 is stored in the first sub array SBA21 of the second bank array 320 and the second main data MD2 is read from the first sub array SBA21 of the second bank array 310. The second row decoder 260b stores the second main data MD2 in a memory cell row connected to a first word-line WL21 or reads the second main data MD2 from the memory cell row connected to the first word-line WL21 by enabling the first word-line WL21 in the first sub array SBA21.

Main data MD may also be stored in and read from the second sub arrays SBA12 and SBA22 in the first density mode of the semiconductor memory device 200a, such that each of the first sub arrays SBA11 and SBA21 and each of the second sub arrays SBA12 and SBA22 may be used as data regions for storing data.

As shown in FIGS. 3, 8 and 14, in the second density mode of the semiconductor memory device 200a, the first main data MD1 is provided to the error correction circuit 400 and the error correction circuit 400 generates parity data PRT1 associated with the first main data MD1. The first main data MD1 is stored in the first sub array SBA11 of the first bank array 310 and the first main data MD1 is read from the first sub array SBA11 of the first bank array 310. The parity data PRT1 is stored in the second sub array SBA22 of the second bank array 320 and the parity data PRT1 is read from the second sub array SBA22 of the second bank array 320. Similarly, when the second main data MD2 is stored in the first sub array SBA21 of the second bank array 320, a parity data PRT2 associated with the second main data MD2 is stored in the second sub array SBA12 of the first bank array 310. The error correction circuit 400 may generate a first corrected main data C_MD1 based on the first main data MD1 and the parity data PRT1.

In the second density mode, the first word-lines WL11 and WL21 are simultaneously enabled.

As is noted from referring to FIGS. 13 and 14, a first storage capacity of the semiconductor memory device 200a in a first density mode is greater than a second storage capacity of the semiconductor memory device 200a in a second density mode different from the first density mode.

As described with reference to FIGS. 2 through 14, the semiconductor memory device 200a stores data in the memory cell array 300 without passing through the error correction circuit 400 in the first density mode, stores the data in a first region of the memory cell array 300 and stores parity data in a second region of the memory cell array 300 via the error correction circuit 400 in the second density mode. In this case, an input/output path for the data stored in the first region is different from an input/output path for the parity data stored in the second region. Therefore, yield of the semiconductor memory device 200a may be increased and cost of the semiconductor memory device 200a may be reduced.

Figure 15:
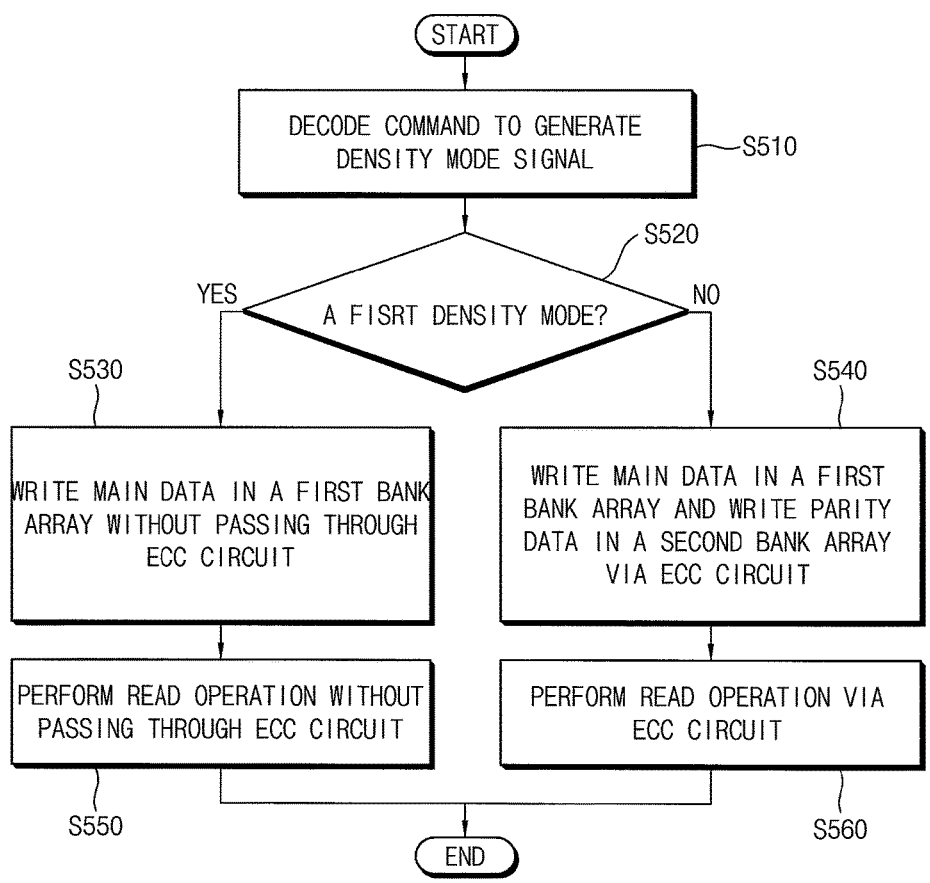
FIG. 15 is a flow chart illustrating a method of operating a semiconductor memory device according to exemplary implementations.

FIG. 15 is a flow chart illustrating a method of operating a semiconductor memory device according to example embodiments.

As shown in FIGS. 2 through 15, in a method of operating a semiconductor memory device 200a that includes a memory cell array 300 having a plurality of bank arrays 310~340 each having first and second sub arrays, a control logic circuit 210 controlling access to the memory cell array 300 and an error correction circuit 400, the control logic circuit 210 generates density mode signal DMS by decoding a command DMS (S510). ECC encoding is selectively performed in write data based on the density mode signal DMS (S520, S530 and S540).

When the density mode signal DMS designates a first density mode (YES in S520), the control logic circuit 210 controls an I/O gating circuit 290 such that the write data is stored in the memory cell array 300 without passing through the error correction circuit 300 (S530). In the first density mode, the first and second sub arrays may be used as data regions for storing the write data. When the density mode signal DMS designates a second density mode (NO in S520), the control logic circuit 210 controls the I/O gating circuit 290 such that the write data is stored in the memory cell array 300 via the error correction circuit 300 (S540). In the second density mode, the first sub array may be used as a data region for storing the write data and the second sub array may be used as a parity region for storing parity data.

The first sub array and the second sub array may belong to different bank arrays.

Read operation without passing through the error correction circuit 400 is performed (S550) after performing the step (S530) and read operation via the error correction circuit 400 is performed (S560) after performing the step (S540)

Figure 16:
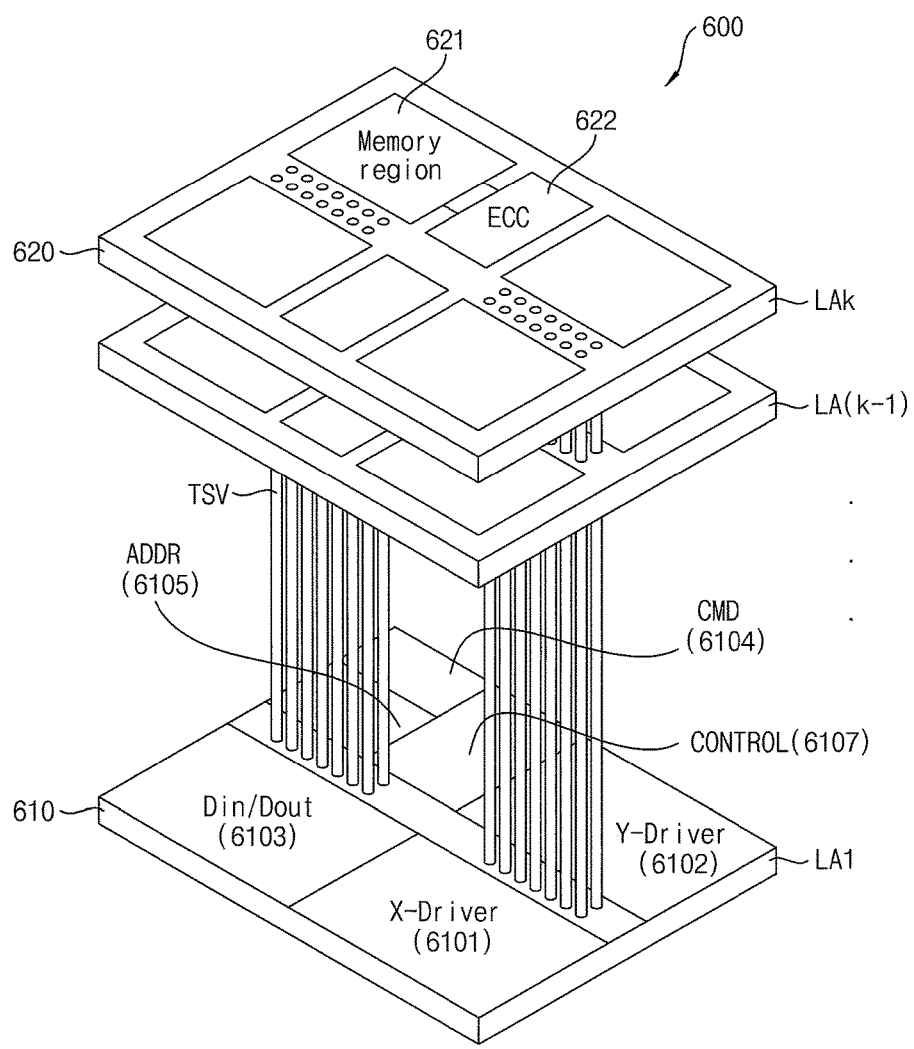
FIG. 16 is a structural diagram illustrating a semiconductor memory device according to exemplary implementations.

FIG. 16 is a structural diagram illustrating a semiconductor memory device according to example embodiments.

As shown in FIG. 16, a semiconductor memory device 600 may include first through pth semiconductor integrated circuit layers LA1 through Lak (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged, and each of the plurality of bank arrays may include a first sub array and a second sub array as described with reference to FIGS. 3, 7 and 8.

The first semiconductor integrated circuit layer 610 may further include a control logic (circuit) 6107. The control logic 6107 may access the memory region 621 and may generate control signals for accessing the memory region 621 based on the command from the memory controller.

The kth semiconductor integrated circuit layer 620 may include an error correction circuit 622 that performs an ECC encoding on data to be stored in the memory region 621 and performs an ECC decoding on data read from the memory region 621 in the second density mode. The semiconductor memory device 600 stores data in the memory region 621 without passing through the error correction circuit 622 in the first density mode, stores the data in a first region of the memory region 621 and stores parity data in a second region of the memory region 621 via the error correction circuit 621 in the second density mode. Therefore, yield of the semiconductor memory device 600 may be increased and cost of the semiconductor memory device 600 may be reduced.

Figure 17:
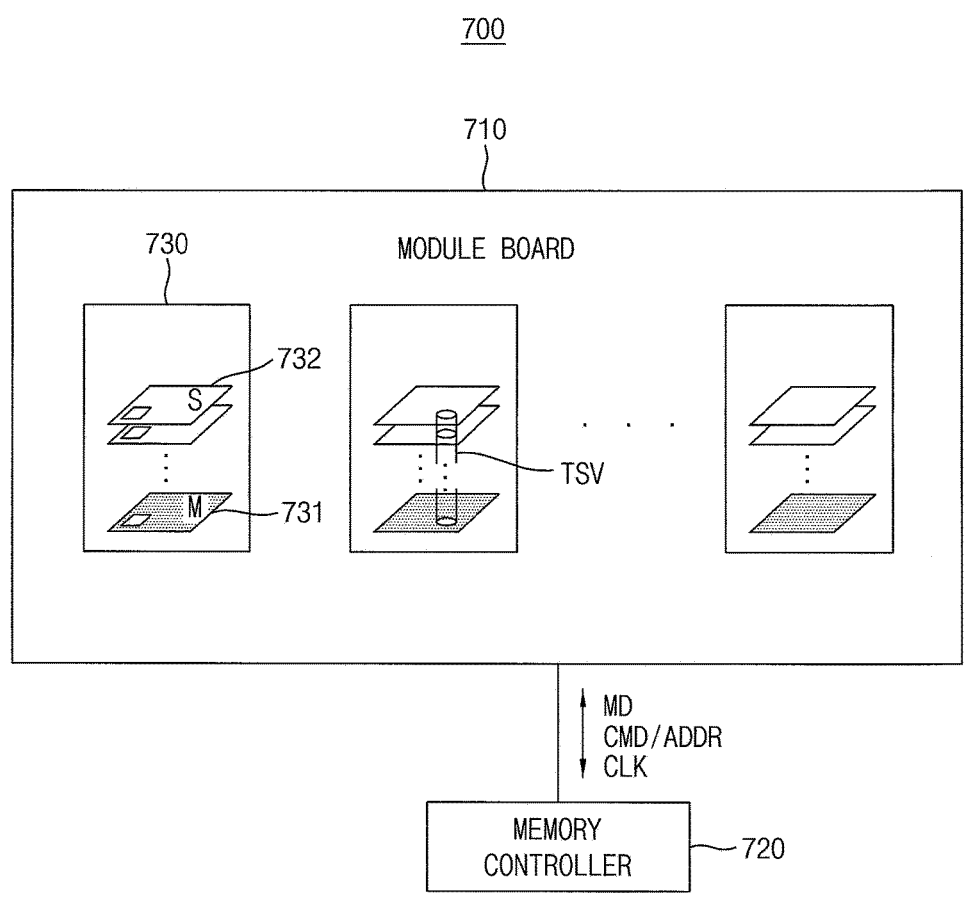
FIG. 17 illustrates a memory system including the semiconductor memory device according to exemplary implementations.

FIG. 17 illustrates a memory system including the semiconductor memory device according to example embodiments.

As shown in FIG. 17, a memory system 700 may include a memory module 710 and a memory controller 720. The memory module 710 may include at least one semiconductor memory device 730 mounted on a module board. The semiconductor memory device 730 may employ the semiconductor memory device 200*a* of FIG. 3. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200*a* of FIG. 3. Therefore, each of the master chip 731 and the slave chip 732 may include a memory cell array and an error correction circuit as described with reference to FIGS. 2 through 14. Each of the master chip 731 and the slave chip 732 stores data in the memory cell array without passing through the error correction circuit in the first density mode, stores the data in a first region of the memory cell array and stores parity data in a second region of the memory cell array via the error correction circuit in the second density mode. In this case, an input/output path for the data stored in the first region is different from an input/output path for the parity data stored in the second region. Therefore, yield of the memory system 700 may be increased.

In addition, in embodiments of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648, which are hereby incorporated by reference in their entirety.

The memory module 710 may communicate with the memory controller 720 via a system bus. Main data MD, a command/address CMD/ADDR, and a clock signal CLK may be transmitted and received between the memory module 710 and the memory controller 720 via the system bus.

Figure 18:
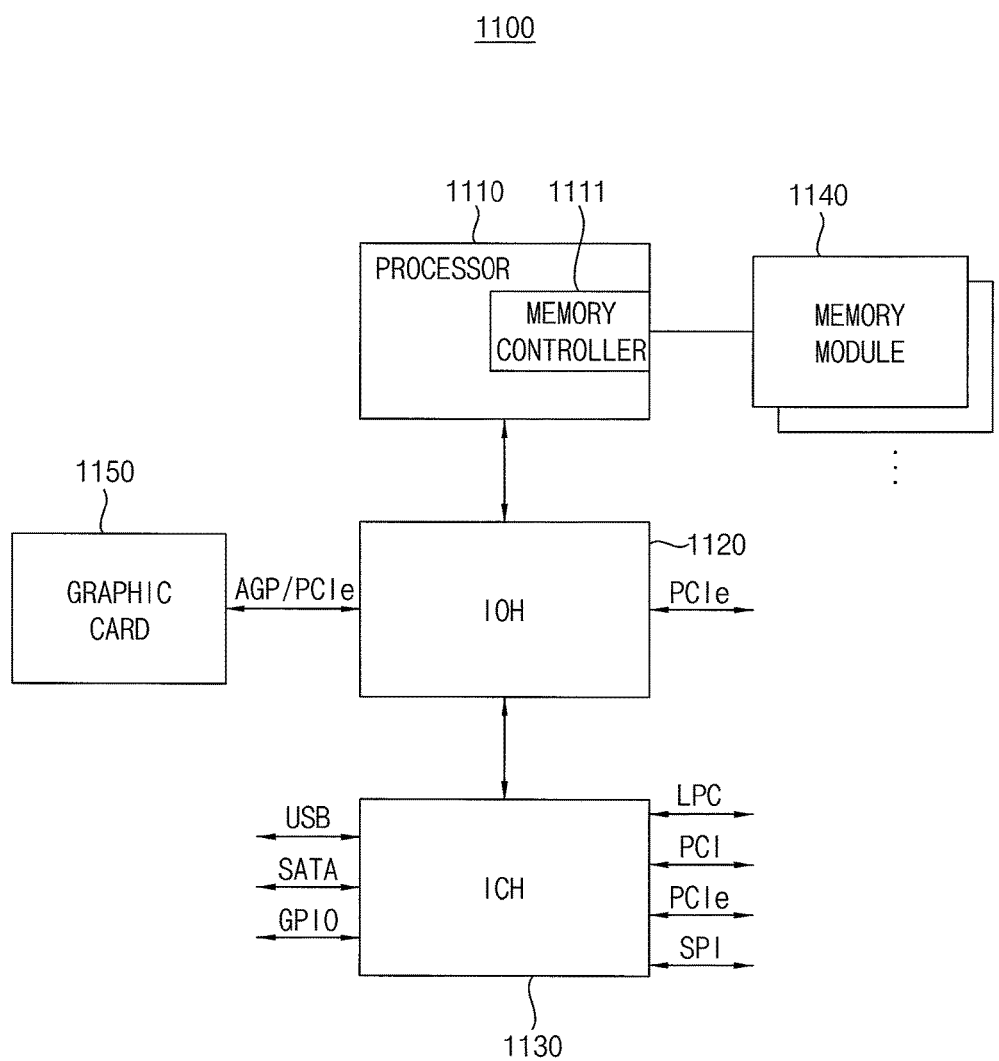
FIG. 18 is a block diagram illustrating a computing system including the semiconductor memory device according to exemplary implementations.

FIG. 18 is a block diagram illustrating a computing system including the semiconductor memory device according to example embodiments.

As shown in FIG. 18, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device of FIG. 3. Therefore, each of the plurality of semiconductor memory devices may include a memory cell array and an error correction circuit as described with reference to FIGS. 2 through 14. Each of the semiconductor memory devices stores data in the memory cell array without passing through the error correction circuit in the first density mode, stores the data in a first region of the memory cell array and stores parity data in a second region of the memory cell array via the error correction circuit in the second density mode. In this case, an input/output path for the data stored in the first region is different from an input/output path for the parity data stored in the second region. Therefore, yield and usability of the memory system 700 may be increased.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 23 illustrates the computing system 1100 including one input/output hub 1120, in some embodiments, the computing system 1100 may include a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some exemplary implementations, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Aspects of the herein described exemplary implementations may be applied to systems using semiconductor memory devices. For example, aspects of the present inventive concept may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of exemplary implementations and is not to be construed as limiting thereof. Although a few exemplary implementations have been described, those skilled in the art will readily appreciate that many modifications are possible in the exemplary implementations without materially departing from the novel teachings and advantages of the herein described subject matter. Accordingly, all such modifications are intended to be included within the scope of the present inventive concept as defined in the claims.

What is claimed is:
1. A semiconductor memory device, comprising:
a memory cell array including a plurality of bank arrays;
a control logic circuit configured to control access to the memory cell array and configured to generate a density mode signal based on a command;
an error correction circuit; and
a first path selection circuit configured to selectively provide write data to at least one of the bank arrays via a first data path that bypasses the error correction circuit in response to the density mode signal having a first state and to provide write data to the error correction circuit via a second data path in response to the density mode signal having a second state,
wherein the control logic circuit is configured to output the density mode signal having the second state to the first path selection circuit such that the write data is received by the error correction circuit in a second density mode different from a first density mode, wherein each of the bank arrays includes at least a first sub array and a second sub array that are distinct from each other by at least one bit of a row address, wherein a first parity data associated with a first write data stored in the first sub array of a first bank array of the bank arrays is stored in the second sub array of a second bank array of the bank arrays, and wherein a second parity data associated with a second write data stored in the first sub array of the second bank array is stored in the second sub array of the first bank array.

2. The semiconductor memory device of claim 1, wherein the control logic circuit is configured to output the density mode signal having the first state to the first path selection circuit such that the write data does not pass through the error correction circuit in a first density mode.

3. The semiconductor memory device of claim 1, wherein the error correction circuit is configured to generate parity data by performing an error correction code (ECC) encoding on the write data in the second density mode, and wherein the first sub array is used as a data region in which the write data is stored and the second sub array is used as a parity region in which the parity data is stored in the second density mode.

4. The semiconductor memory device of claim 3, wherein an input/output path for the write data is different from an input/output path for the parity data.

5. The semiconductor memory device of claim 1, wherein a first word-line connected to a first memory cell row in the first sub array of the first bank array and a second word-line connected to a second memory cell row in the second sub array of the second bank array are simultaneously enabled.

6. The semiconductor memory device of claim 1, further comprises an input/output gating circuit connected to the memory cell array, the error correction circuit and the first path selection circuit, and wherein a number of circuit components, in the I/O gating circuit, associated with an access to the memory cell array is constant without regard to a density mode designated by the density mode signal.

7. The semiconductor memory device of claim 1, wherein a first storage capacity of the semiconductor memory device in the first density mode is greater than a second storage capacity of the semiconductor memory device in the second density mode.

8. The semiconductor memory device of claim 1, further comprising a second path selection circuit configured to selectively provide the error correction circuit with read data stored in the memory cell array, in response to the density mode signal.

9. The semiconductor memory device of claim 8, wherein the error correction circuit comprises:

an error correction code (ECC) engine configured to generate syndrome data by performing an ECC decoding the read data and parity data stored in the memory cell array; and a data corrector configured to selectively correct at least one error bit in the read data based on the syndrome data.

10. The semiconductor memory device of claim 9, wherein the data corrector comprises:

a syndrome decoder configured to generate a decoding signal and a selection signal by decoding the syndrome data, the decoding signal indicating a position of the at least one error bit, and the selection signal having a logic level depending on a number of the at least one error bit;

a bit inverter configured to invert the at least one error bit based on the decoding signal; and a selection circuit configured to output one of an output of the bit inverter and the read data in response to the selection signal.

11. The semiconductor memory device of claim 1, wherein the memory cell array includes a three-dimensional memory cell array and each of the bank arrays includes a plurality of dynamic memory cells.

12. The semiconductor memory device of claim 1, wherein the memory cell array includes a three-dimensional memory cell array and each of the bank arrays includes a plurality of resistive type memory cells.

13. A memory system comprising:

at least one semiconductor memory device; and a memory controller configured to control the at least one semiconductor memory device, wherein the at least one semiconductor memory device comprises:

a memory cell array including a plurality of bank arrays;

a control logic circuit configured to control access to the memory cell array and configured to generate a density mode signal based on a command from the memory controller;

an error correction circuit;

a first path selection circuit configured to selectively provide write data to at least one of the bank arrays via a first data path that bypasses the error correction circuit in response to the density mode signal having a first state and write data to the error correction circuit via a second data path in response to the density mode signal having a second state; and a second path selection circuit configured to selectively provide the error correction circuit with read data stored in the memory cell array, in response to the density mode signal, wherein the error correction circuit comprises:

an error correction code (ECC) engine configured to generate syndrome data by performing an ECC decoding the read data and parity data stored in the memory cell array; and a data corrector configured to selectively correct at least one error bit in the read data based on the syndrome data, wherein the data corrector comprises:

a syndrome decoder configured to generate a decoding signal and a selection signal by decoding the syndrome data, the decoding signal indicating a position of the at least one error bit, and the selection signal having a logic level depending on a number of the at least one error bit;

a bit inverter configured to invert the at least one error bit based on the decoding signal; and a selection circuit configured to output one of an output of the bit inverter and the read data in response to the selection signal.

14. A semiconductor memory device, comprising:

a memory cell array comprising a plurality of bank arrays;

a control logic circuit configured to control access to the memory cell array and configured to generate a density mode signal based on a received external command and an address;

an error correction circuit configured to correct bit errors in the memory cell array;

a first path selection circuit configured to provide write data in first or second bank arrays in response to the density mode signal received from the control logic circuit relating to a first density mode; and a second path selection circuit configured to transmit write data to the error correction circuit to generate an error correction code associated with the transmitted write data in response to the density mode signal received from the logic control circuit relating to a second density mode which differs from the first density mode, wherein the write data is not processed by the error correction circuit in the first density mode, wherein the control logic circuit is configured to output the density mode signal to the first path selection circuit such that the write data is received by the error correction circuit in the second density mode, wherein each of the bank arrays includes at least a first sub array and a second sub array that are distinct from each other by at least one bit of a row address, wherein a first parity data associated with a first write data stored in the first sub array of a first bank array of the bank arrays is stored in the second sub array of a second bank array of the bank arrays, and wherein a second parity data associated with a second write data stored in the first sub array of the second bank array is stored in the second sub array of the first bank array.

15. The semiconductor memory device of claim 14, wherein the error correction circuit is configured to output the error correction code for storage in the second bank array.

16. The semiconductor memory device of claim 14, further comprising a memory controller configured to control the memory cell array by transmitting commands to the control logic circuit.

17. The semiconductor memory device of claim 14, wherein the second path selection circuit is configured to selectively provide the error correction circuit with read data stored in the memory cell array in response to receiving the density mode signal relating to the second density mode.

18. The semiconductor memory device of claim 17, wherein the error correction code is parity data and the error correction circuit comprises:

a syndrome generation circuit configured to generate syndrome data by processing the read data and parity data stored in the memory cell array; and a data correction circuit configured to selectively correct at least one error bit in the read data based on the syndrome data.

19. The memory system of claim 13, wherein the control logic circuit is configured to output the density mode signal having the first state to the first path selection circuit such that the write data does not pass through the error correction circuit in a first density mode.

20. The memory system of claim 13, further comprises an input/output gating circuit connected to the memory cell array, the error correction circuit and the first path selection circuit, and wherein a number of circuit components, in the I/O gating circuit, associated with an access to the memory cell array is constant without regard to a density mode designated by the density mode signal.

* * * * *